United States Patent
Crowe

(10) Patent No.: US 10,605,381 B2
(45) Date of Patent: Mar. 31, 2020

(54) TRANSIT CASE CABLE HANGER

(71) Applicant: Raytheon Company, Waltham, MA (US)

(72) Inventor: Ian Crowe, Billerica, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/055,067

(22) Filed: Aug. 4, 2018

(65) Prior Publication Data

US 2020/0041041 A1 Feb. 6, 2020

(51) Int. Cl.
*F16L 3/137* (2006.01)
*H05K 7/14* (2006.01)
*F16L 3/24* (2006.01)

(52) U.S. Cl.
CPC ............ *F16L 3/137* (2013.01); *H05K 7/1491* (2013.01); *F16L 3/24* (2013.01)

(58) Field of Classification Search
CPC ........... F16L 3/137; F16L 3/24; H05K 7/1491
USPC ............ 248/68.1, 74.3; 211/118; 361/679.58
See application file for complete search history.

(56) References Cited

U.S. PATENT DOCUMENTS

| | | | |
|---|---|---|---|
| 1,144,593 A | 6/1915 | Heiser | |
| 1,206,203 A | 11/1916 | Brockway | |
| 1,262,763 A * | 4/1918 | Farley | F16L 3/14 |
| | | | 248/62 |
| 3,463,427 A | 8/1969 | Fisher | |
| 3,709,373 A | 1/1973 | Aguilar | |
| 3,861,015 A | 1/1975 | Hooven | |
| 4,274,612 A | 6/1981 | Massey | |
| 4,447,934 A | 5/1984 | Anscher | |
| 5,027,960 A | 7/1991 | Rainville | |
| 5,564,658 A | 10/1996 | Rinderer | |
| 6,581,885 B2 | 6/2003 | Polad | |
| 6,959,898 B1 | 11/2005 | Laughlin et al. | |
| 7,092,258 B2 | 8/2006 | Hardt et al. | |
| 9,054,449 B2 | 6/2015 | Utz et al. | |

(Continued)

OTHER PUBLICATIONS

B & H Foto & Electronics Corp., Middle Atlanctic CLAW14 14" Wallmount Cable Hanger, https://www.bhphotovideo.com/c/product/499003-REG/Middle_Atlantic_CLAW14_CLAW14_14_Wallmount_Cable.html, to best of applicant's knowledge article was available before the application filed, New York, NY.

(Continued)

*Primary Examiner* — Muhammad Ijaz

(57) ABSTRACT

A hanger assembly comprises an elongate hanger anchor, a hanger support, and a plurality of flexible hangers for supporting a plurality of electronics cables. The elongate hanger anchor can comprise an attachment device for securing the elongate hanger anchor to a structure, such as a chassis of an electronics assembly, and the elongate hanger anchor can be interfaced to an outer rigid support panel of the chassis. The hanger support can extend or hang generally orthogonally from an end of the elongate hanger anchor, and the hanger support can support the plurality of flexible hangers for supporting the electronics cables coupled to the electronics assembly. The flexible hangers can each comprise a releaseable attachment device to operate the flexible hanger to an engaged position to the support hanger when supporting cables to the flexible hanger.

18 Claims, 6 Drawing Sheets

(56) References Cited

U.S. PATENT DOCUMENTS

| | | | |
|---|---|---|---|
| 9,709,192 B1 | 7/2017 | Newcomb et al. | |
| 2004/0120133 A1* | 6/2004 | Nguyen | H05K 7/1491 |
| | | | 361/825 |
| 2006/0080933 A1 | 4/2006 | Robicheau | |
| 2008/0083096 A1* | 4/2008 | Wilkinson | B65H 75/366 |
| | | | 24/298 |
| 2010/0264279 A1* | 10/2010 | Allen | B65H 75/366 |
| | | | 248/68.1 |
| 2014/0153186 A1* | 6/2014 | Liu | G06F 1/189 |
| | | | 361/679.58 |

OTHER PUBLICATIONS

B & H Foto & Electronics Corp., photo, https://static.bhphoto.com/images/images500x500/Middle_Atlantic_HCM_1D_HCM_1D_1_Space_Horizontal_Cable_1232975136000_419958.jpg, to best of applicant's knowledge article was available before the application filed, New York, NY.

Bonus Power Systems, Ellis Patents Cable Hangers and Hooks, http://www.cable-jointing.com/ellis-patents-cable-hangers-and-hooks, to best of applicant's knowledge article was available before the application filed, United Kingdom.

* cited by examiner

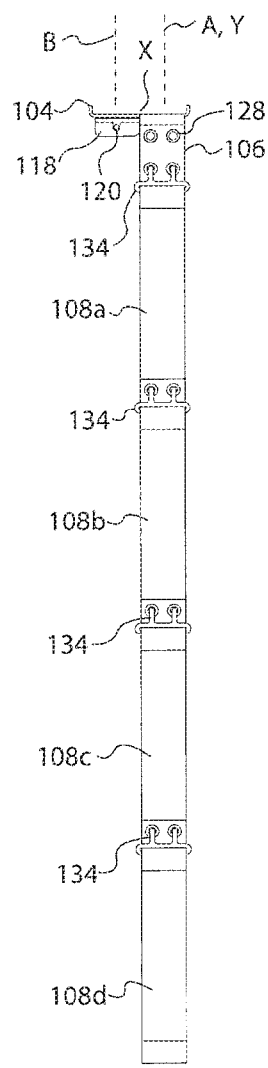
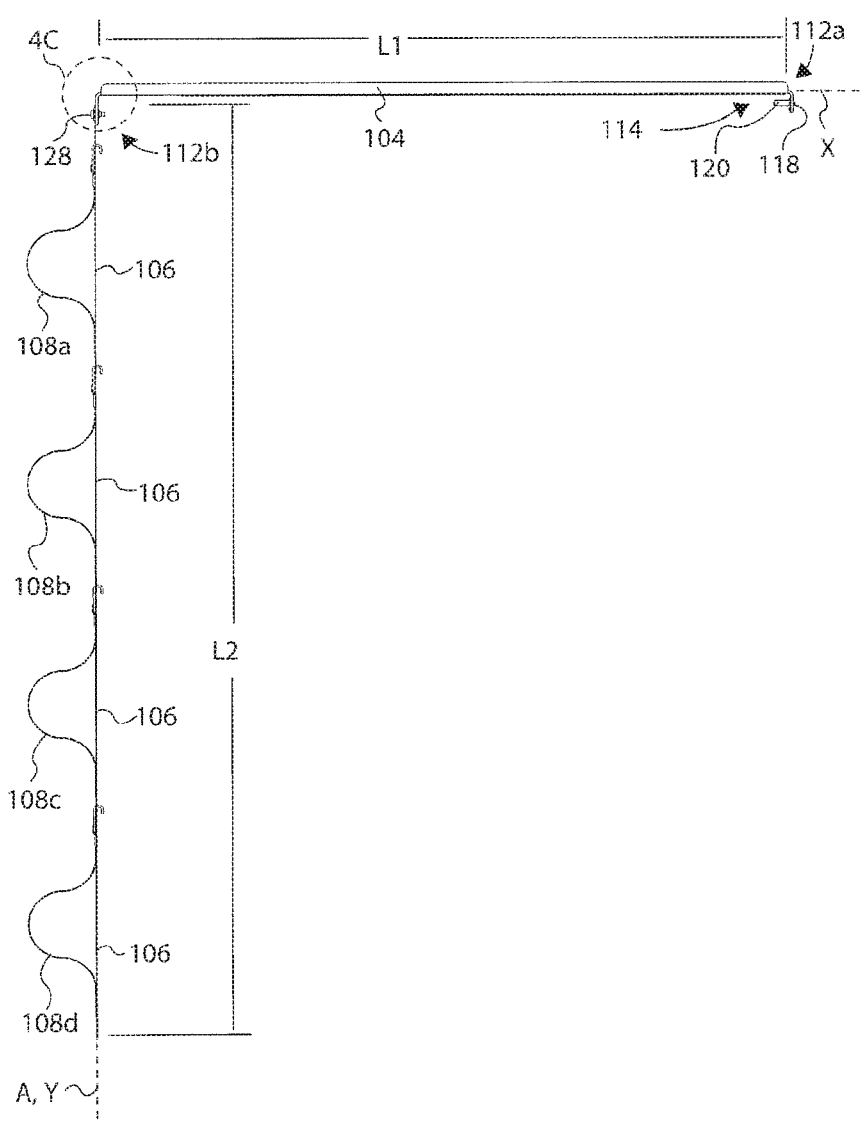
FIG. 4A
FIG. 4B

TRANSIT CASE CABLE HANGER

GOVERNMENT LICENSE RIGHTS

This invention was made with government support under contract No. W31P4Q-14-C-0093 awarded by the United States Army. The government has certain rights in the invention.

BACKGROUND

Electronics cables coupled to an electronics assembly (e.g., servers, cases, etc.) often hang from the electronics assembly in an unsupported manner, which can damage the cables and/or ports of the electronics assembly, particularly when the electronics assembly is moved and the cables are strained from a pulling force. Thus, an undue amount of stress can be exerted on ends of the cables proximate the cable ports and connectors of the electronics assembly when during such movement or transportation. Existing solutions involve providing racks, slots, attachable hangers, cable ties, or other devices that support the cables so that they do not freely hang from the electronics assembly without adequate support. However, some of these solutions can be time consuming or inefficient because they typically require some modification of the chassis or support structure of the electronics assembly, and can require using tools or other devices that complicate the installation processes, which increases set-up time and complexity of the system. Moreover, some of these solutions unnecessarily increase the footprint size of the electronics assembly because they add bulk to the perimeter area of the support structure (e.g., chassis) of the electronics assembly, particularly when the solution includes rigid hanger devices that increase the footprint of the electronics assembly. This can increase the packaging space required when installing the electronics assembly to a larger system. Therefore, a better hanger solution for supporting cables (or other moveable objects like pipes) is desirable, particularly a hanger solution that is readily portable and quick to install/use without unnecessarily increasing the footprint size of the overall system.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIG. 4A is a front view of the hanger assembly shown in FIG. 1.

FIG. 4B is a side view of the hanger assembly shown in FIG. 1.

DETAILED DESCRIPTION

Figure 1:
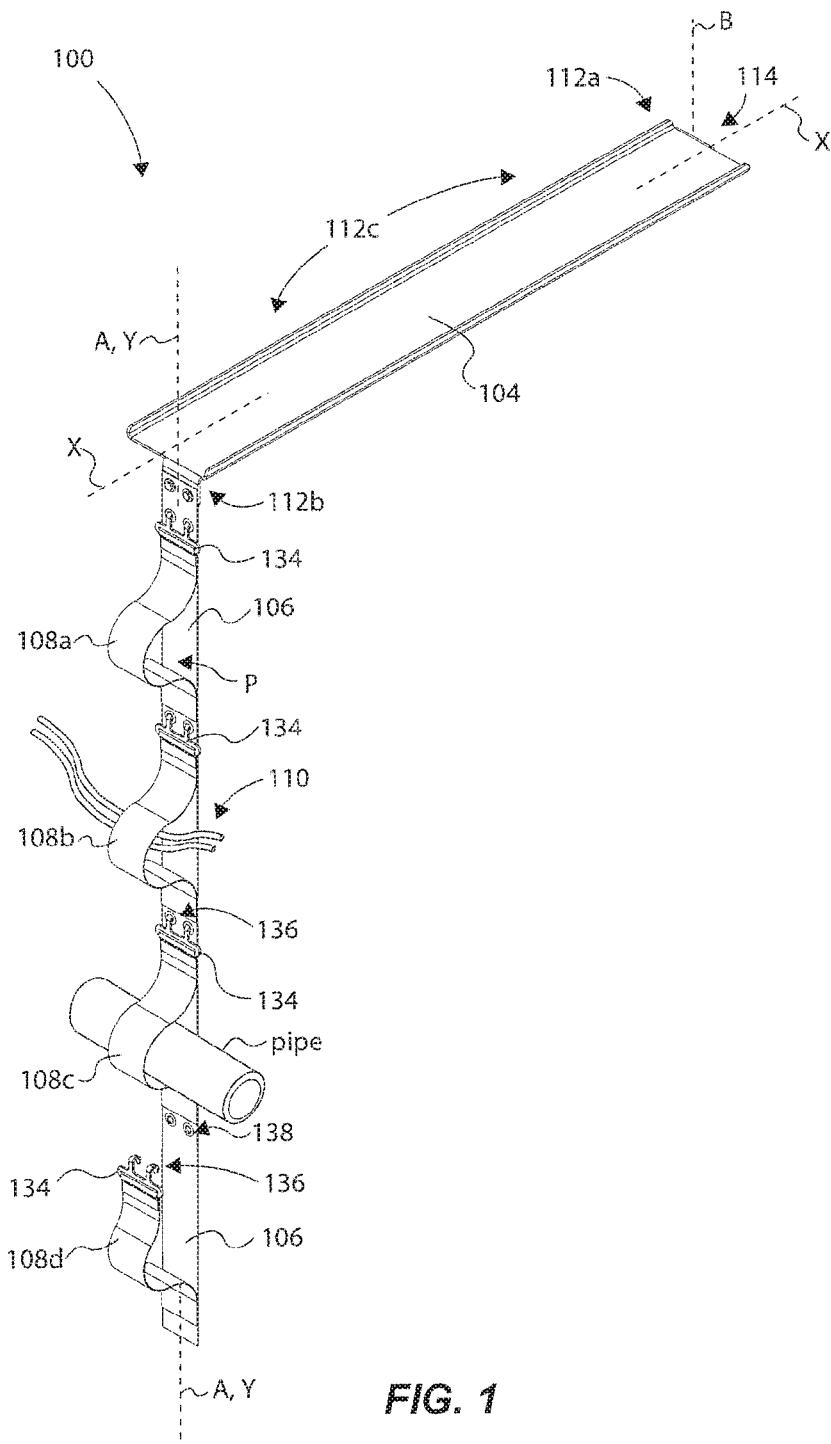
FIG. 1 is an isometric view of a hanger assembly in accordance with an example of the present disclosure.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of the inventive concepts are provided below and then specific examples are described in further detail later. This initial summary is intended to aid readers in understanding the examples more quickly, but is not intended to identify key features or essential features of the examples, nor is it intended to limit the scope of the claimed subject matter.

A hanger assembly for supporting at least one movable component (e.g., cable, line, pipe) comprises an elongate hanger anchor having a first end and a second end. The first end can have an attachment device for securing the elongate hanger anchor to a structure (e.g., chassis of an electronics assembly). A hanger support can extend from the second end of the elongate hanger anchor, and a plurality of flexible hangers can be supported about the hanger support for supporting at least one movable component.

An electronics assembly having a hanger assembly for supporting a plurality of cables coupled to the electronics assembly comprises a chassis comprising an outer rigid support panel and a hanger attachment portion; a plurality of electronics ports supported by the chassis; a plurality of electronics cables coupled to and extending from the plurality of electronic ports; an elongate hanger anchor comprising an attachment device coupled to the chassis (the elongate hanger anchor is interfaced to and extending along the outer rigid support panel of the chassis); a hanger support extending transverse from the hanger support member; and a plurality of flexible hangers coupled to the hanger support and supporting the plurality of electronics cables.

In one example, the hanger attachment portion of the chassis comprises an aperture, and the chassis attachment device comprises a pin extending through the aperture.

In one example, the plurality of flexible hangers are each arranged at different elevations along the hanger support, and the elongate hanger anchor and the chassis cooperatively support the weight of the plurality of electronics cables.

In one example, the outer rigid support panel comprises a substantially planar surface interfaced to a load bearing interface surface of the elongate hanger anchor.

To further describe the present technology, examples are now provided with reference to the figures. FIGS. 1-4D show various views and aspects of a hanger assembly 100 coupleable to an electronics assembly 102 (FIG. 3A) in accordance with an example of the present disclosure. As an overview, the hanger assembly 100 can comprise an elongate hanger anchor 104, a hanger support 106, and a plurality of flexible hangers (e.g., flexible hangers 108a-d, although four flexible hangers is not intended to be limiting in any way as more or less than four is contemplated). The elongate hanger anchor 104 is coupleable to a structure of the electronics assembly 102, while the hanger support 106 (and the flexible hangers 108a-d) hang generally downwardly/vertically from the elongate hanger anchor 104 along a side of the electronics assembly 102, as best illustrated in the example shown in FIG. 3A. In this manner, a plurality of electronics cables 110 can be supported by respective flexible hangers 108a-d (e.g., see 108b) that hang from the elongate hanger anchor 104 via the hanger support 106.

Figure 3A:
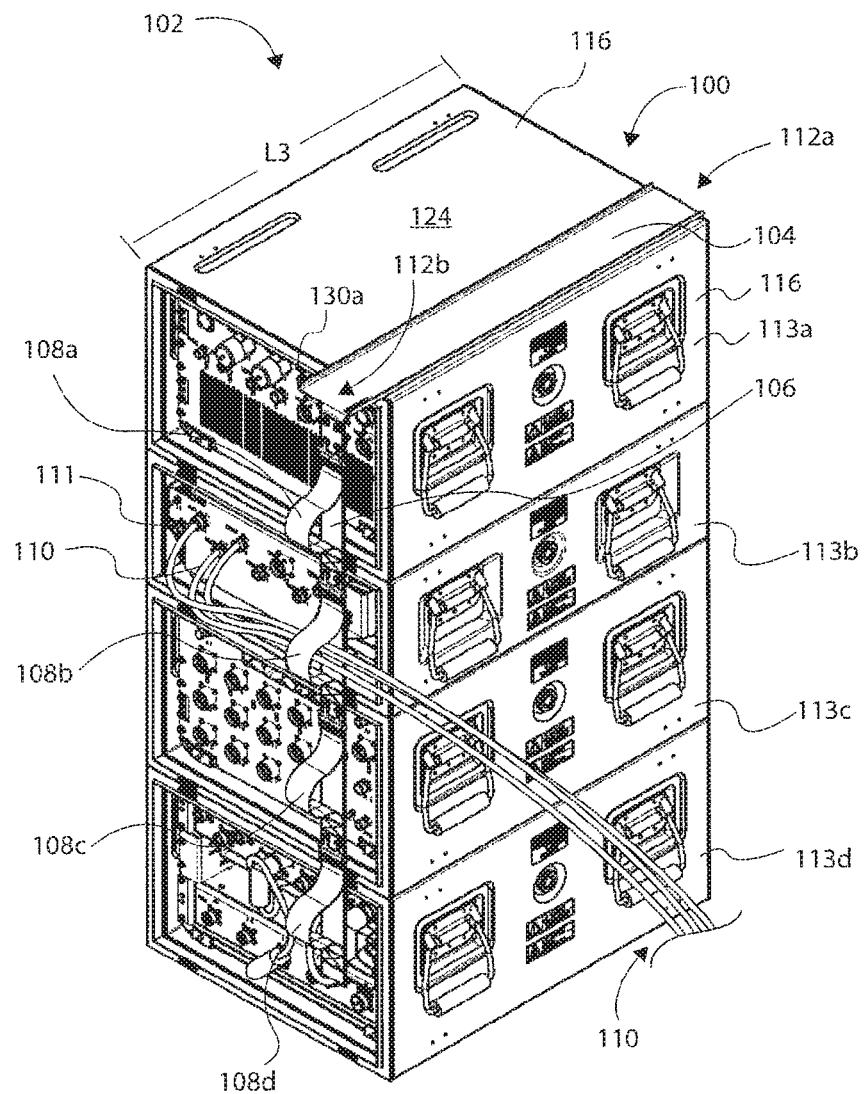
FIG. 3A is an isometric view of the hanger assembly shown in FIG. 1 and coupled to a portable electronics assembly.

As shown in FIG. 3A, the plurality of electronics cables 110 (e.g., movable components) can be coupled to respective ports 111 (one labeled) as part of the electronics assembly 102. Alternatively, the hanger assembly 100 can be used to support other movable components, such as metal pipes, plastic conduits, and/or other elongate components or members that are movable in and out of the flexible hangers 108a-d, such as illustrated in FIG. 1 showing the flexible hanger 108c supporting a pipe.

The elongate hanger anchor 104 can comprise a generally flat or planar strip of rigid material, and can have elongate side flanges extending upwardly (such as with a piece of sheet metal that has been formed or stamped). The elongate hanger anchor 104 can comprise a first end 112a and a second end 112b, and a middle section 112c that extends between the first and second ends 112a and 112b. The first end 112a can comprise an attachment device 114 (FIGS. 2A and 2B) for coupling the elongate hanger anchor 104 to a structure, such as a chassis 116 of the electronics assembly 102.

In one example, the attachment device 114 can comprise an anchor support portion 118 and a pin 120 that extends inwardly from the anchor support portion 118 toward the second end 112b of the elongate hanger anchor 104. The anchor support portion 118 can extend downwardly in a direction generally parallel to the hanger support 106, such as in an L-shaped manner (FIG. 2B), and while the pin 120 can extend inwardly from the anchor support portion 118, In another aspect, the anchor support portion 118 can be formed on an incline as needed or desired.

Figure 3C:
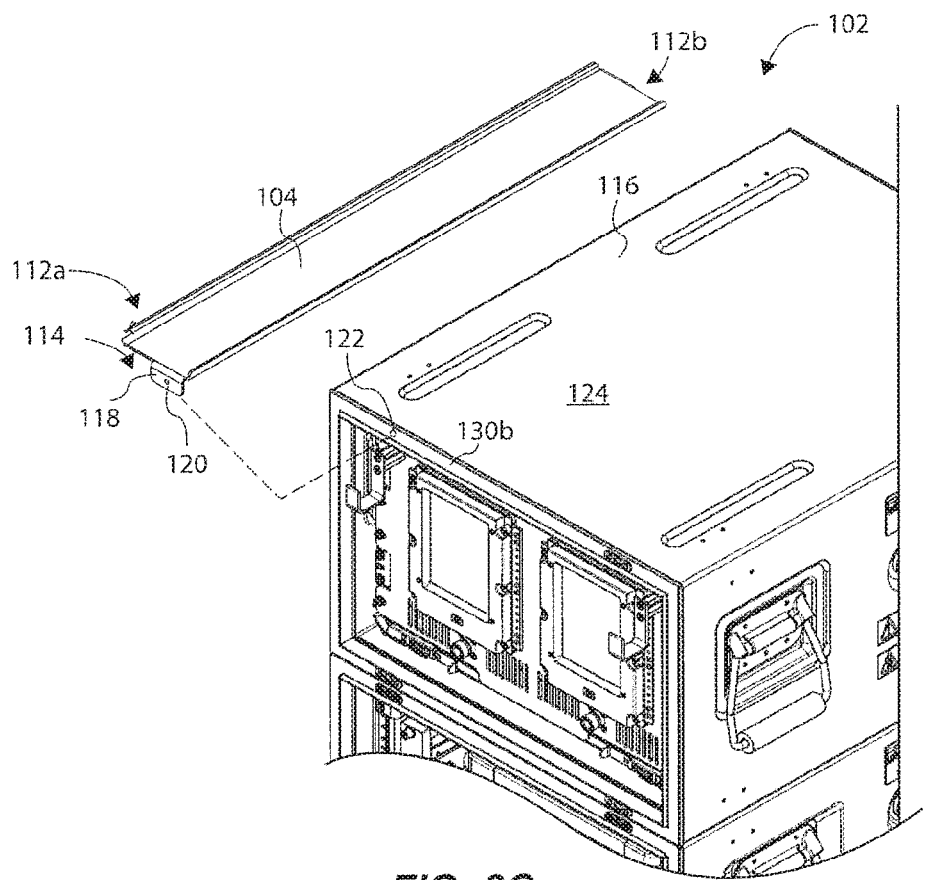
FIG. 3C is a close-up rear view of an elongate hanger anchor of the hanger assembly and the portable electronics assembly shown in FIG. 3A, and showing the elongate hanger anchor exploded away from the portable electronics assembly.
Figure 3B:
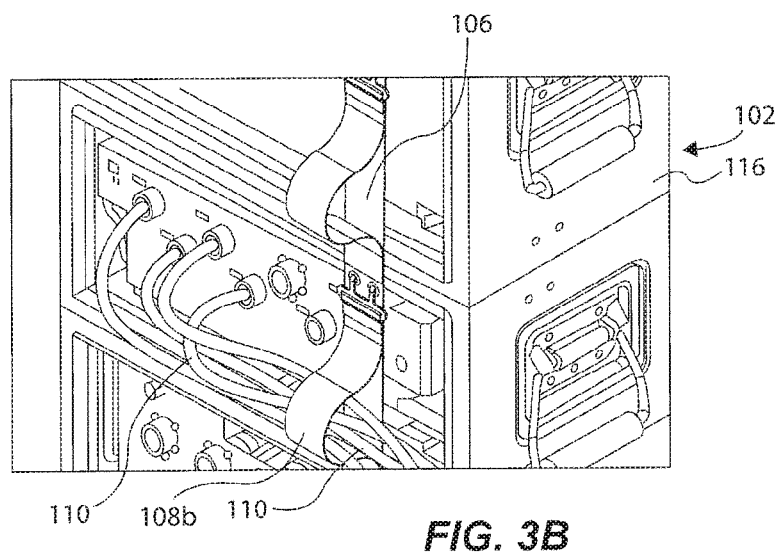
FIG. 3B is a close-up view of a hanger support of the hanger assembly and the portable electronics assembly shown in FIG. 3A, and showing a flexible hanger supporting a plurality of electronics cables.

As shown in FIG. 3C, the pin 120 can be received into a hanger attachment portion of the chassis 116, such as an aperture 122 formed through an outer rigid support panel 124 of the chassis 116. The pin 120 can be sized to be fit through the aperture 122 to resist an upward force exerted to the first end 112a of the elongate hanger anchor 104 due to the weight of the electronics cables 110 pulling downwardly on the second end 112b of the elongate hanger anchor 104 (and the hanger support 106 itself). This "pin and aperture" interface provides a convenient means for removably coupling the hanger assembly 100 to the electronics assembly 102 without the use of tools, because an individual can couple the hanger assembly 100 to the chassis 116 by merely inserting the pin 120 into the aperture 122, and then resting the elongate hanger anchor 104 on the chassis 116, and then hanging the hanger support 106 from the elongate hanger anchor 104, as shown in the example of FIG. 3A. This is one example orientation of the hanger assembly 100, and is advantageous because the electronics assembly 102 will typically be resting on a flat or level support surface, and supported in a vertical manner, as shown in FIG. 3A, so that the hanger support 106 hangs from the elongate hanger anchor 104 due to gravity.

Alternatively, and as will be recognized by those skilled in the art, rather than a pin arrangement, the first end 112a can comprise an attachment device in the form of a hook, snap, or other device that can interface with or attach to a portion of a structure, such as an edge portion, one or more holes, or a corresponding device supported by the structure (e.g., the second component of a snap), and that operates to resist an upward moment proximate the first end 112a.

In one example, the electronics assembly 102 can comprise a plurality of transit cases and electronics systems supported by the transit cases. Transit cases are movable/portable cases that each comprise a rigid chassis (e.g., 116) that supports electronics systems. For example, FIG. 3A shows four transit cases 113a-d stacked on each other in a vertical manner, and that each have a chassis (e.g., 116) comprised of a rigid metal case or frame. Alternatively, the hanger assembly 100 can be coupled to only one transit case (and can have less than four flexible straps), or the hanger assembly 100 can be coupled to a stationary or immovable chassis, such as a server case secured to a floor. In this manner, more than four flexible straps can be incorporated into a particular hanger assembly. In another example, two or more hanger assemblies (e.g., 100) can be coupled to a particular chassis in a side-by-side manner to provide additional/horizontal support for electronics cables, flexible lines, pipes, and/or other movable components.

Figure 4C:
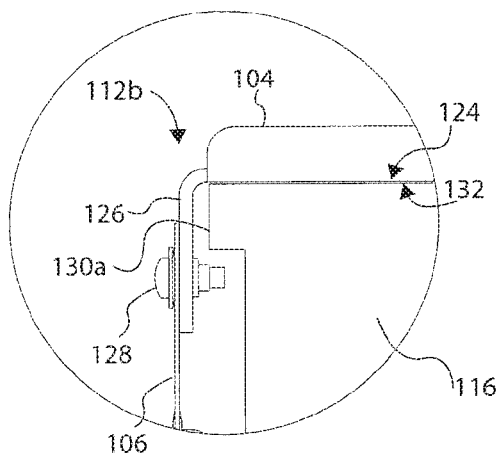
FIG. 4C is a partial side view of a coupling region of the hanger assembly shown in FIG. 1.
Figure 4D:
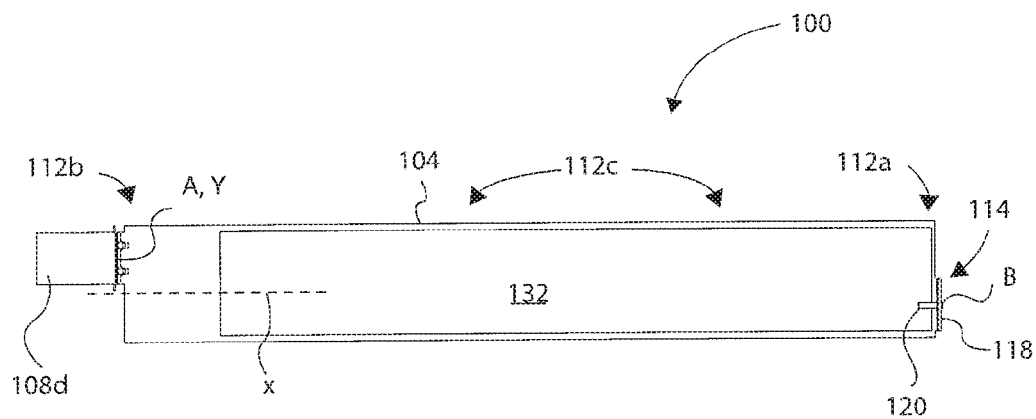
FIG. 4D is a top view of the elongate hanger anchor of the hanger assembly shown in FIG. 1, Reference will now be made to the exemplary embodiments illustrated, and specific language will be used herein to describe the same. It will nevertheless be understood that no limitation of the scope of the invention is thereby intended.

The hanger support 106 can comprise an elongate flexible strap, such as a woven fabric strap, that is attached to the second end 112b of the elongate hanger anchor 104 by a suitable means. In one example, as shown in FIG. 4C, the second end 112b of the elongate hanger anchor 104 can comprise a coupling flange 126 that extends or transitions downwardly toward the hanger support 106. One or more fasteners 128 (e.g., screws, bolts/nuts, rivets, or any other suitable fastener(s)) can couple one end of the hanger support 106 to the coupling flange 126. Alternatively, other than using a fastener, other attachment means are possible, such as adhesive, clips, staples, etc. In one example, the coupling flange 126 can be biased to (or proximate to) an edge portion 130a (FIGS. 3A and 4C) of the chassis 116, which restricts axial movement of the elongate hanger anchor 104 because the coupling flange 126 may impact or interface with the edge portion 130a to restrict or limit axial movement of the elongate hanger anchor 104, which helps to prevent the pin 120 from falling out of the aperture 122. Similarly, the anchor support portion 118 achieves the same functionality about the first end 112a of the elongate hanger anchor 104, because the anchor support portion 118 can interface with an opposing edge portion 130b to restrict axial movement of the elongate hanger anchor 104 to maintain its orientation and position on the chassis 116. Thus, the anchor support portion 118 and the coupling flange 126 (being parallel to each other) straddle the upper support panel 124 of the chassis 116, which restricts undesirable axial movement of the elongate hanger anchor 104 to maintain its position on the chassis 116.

Figure 2A:
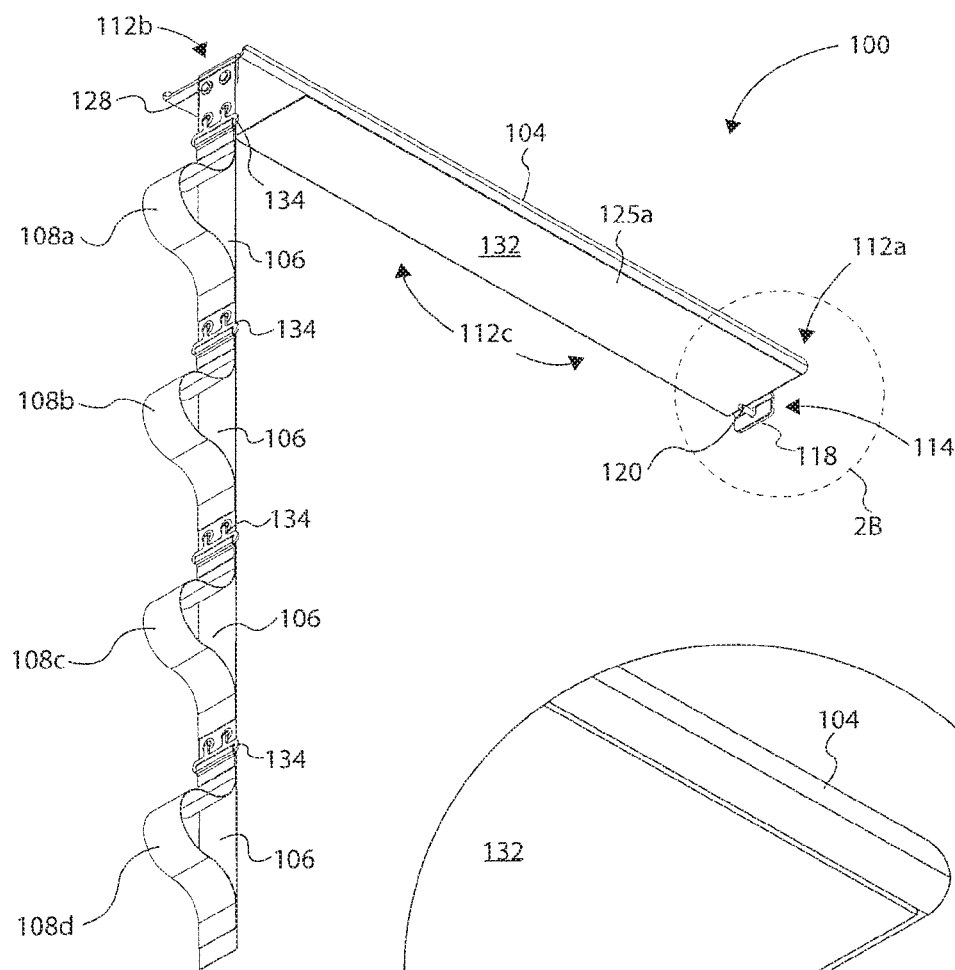
FIG. 2A is an isometric view of an underneath side of the hanger assembly shown in FIG. 1.
Figure 2B:
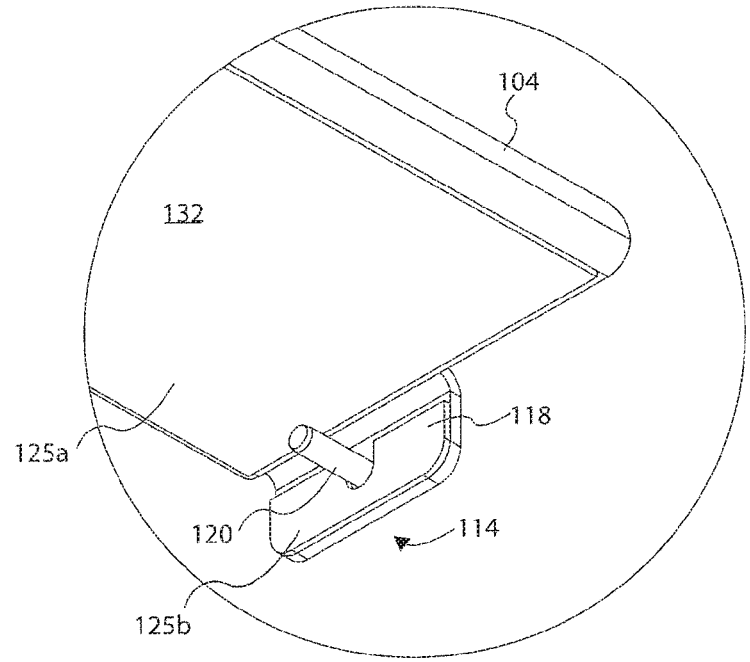
FIG. 2B is a close-up view of a portion of the hanger assembly shown in FIG. 2A.

With particular reference to FIG. 2A, the elongate hanger anchor 104 can comprise a load bearing interface surface 132 that extends along an underneath side about the middle section 112c of the elongate hanger anchor 104. The load bearing interface surface 132 can comprise a generally planar surface that is interfaced to (or overlaid to) an upper planar surface of the outer rigid support panel 124 to help support a weight of the flexible cables 110 extending through the flexible hangers 108a-d. The load bearing interface surface 132 is configured in this manner, and is interfaced to the chassis 116 in this way, so that some or all of the weight of the electronic cables 110 is distributed along some or all of a length of the elongate hanger anchor 104, which is dictated by the particular length of the outer rigid support panel 124 (see further discussion below). This provides a very robust hanger assembly that can support a relatively large amount of cables (or other objects) and their associated weight.

In one example, a friction component 125a, such as panel or strip of rubber, foam, etc., can be attached (e.g., glued) to the lower surface of the elongate hanger anchor 104 to increase friction between the elongate hanger anchor 104 and the rigid outer support panel 124 to reduce wear. Thus, a lower surface of the friction component 125a can define the load bearing surface 132 of the elongate hanger anchor 104 when used. Another friction component 125b can be attached to an inner surface of the coupling flange 126 for similar purposes.

In one example, the coupling flange 126 of the elongate hanger anchor 104 can be offset laterally relative to the attachment device 114 to provide lateral support of the hanger assembly 100 when coupled to the chassis 116. More specifically, the coupling flange 126 can comprise a central axis A (see FIGS. 1 and 4A) that extends longitudinally (and vertically) through a central portion of the coupling flange 126 (i.e., generally parallel to, and through, the hanger support 106). The central axis A can extend about a downward moment of force exerted on the coupling flange 126 due to the weight of the flexible hangers 108a-d and the electronics cables 110. Similarly, the attachment device 114 (e.g., the pin 120) can comprise a central axis B that extends vertically through a central portion of the pin 120 (i.e., generally parallel to the hanger support 106 and the central axis A). The central axis B can extend about an upward moment of force exerted on the attachment device 114 (e.g., pin 120) due to the weight of the flexible hangers 108a-d and the electronics cables 110 that tend to upwardly bias the first end 112a (because the second end 112b acts as a pivot point against an upper edge portion of the chassis 116). Thus, the central axis A is laterally offset from the central axis B relative to a first longitudinal axis X of the elongate hanger anchor 104. This results in a laterally supported hanger assembly 100, because the location of the attachment device 114 and the location of the coupling flange 126 (being laterally offset from each other) tend to restrict or limit the elongate hanger anchor 104 from twisting or rotating relative to the first longitudinal axis X due to the weight and/or movement of the cables 110. This configuration also relieves stress on the pin 120, because some of the load to the pin 120 is distributed laterally along the width of the elongate hanger anchor 104. Thus, the elongate hanger anchor 104 provides two anchor points (i.e., the pin 120 and the coupling flange 126) that are laterally offset from each other to provide lateral support for the hanger assembly 100 as supporting cables 110 (or other movable components).

When coupled to the chassis 116, the hanger assembly 100 can have a generally ninety degree shape or configuration. More particularly, the elongate hanger anchor 104 can define the first longitudinal axis X along its length, and the hanger support 106 can define a second longitudinal axis Y that extends transverse, and generally orthogonal, to the first longitudinal axis X. Prior attempts at hangers merely attach a top section of a hanger to a structure with an attachment device (e.g., bolt, screw), which places all or most of the load of the weight of the supported components onto such attachment device, which can overly strain this attachment device. In the present example, however, the hanger assembly 100 can comprise a ninety degree or orthogonal configuration because the elongate hanger anchor 104 can comprise an elongate rigid member that extends along and overlays to a support surface, such as the outer rigid support panel 124 of the chassis 116. Thus, some of the load imparted by the weight of the cables 110 is distributed along a length of the elongate hanger anchor 104. This configuration also remotely places some of such load proximate the attachment device 114 that is remotely located away from the attachment region where the hanger support 106 is attached to the coupling flange 126 proximate the second end 112b of the elongate hanger anchor 104.

With particular reference to FIGS. 1 and 3A, the plurality of flexible hangers 108a-d can be arranged linearly along a length L2 of the hanger support 106, and can be provided about the hanger support 106 at different positions or locations. In one example, each flexible hanger 108a-d can comprise a releasable attachment device 134 at an upper end that is operable between an engaged position and a disengaged position (this can further comprise a locked position and an unlocked position depending upon if a locking mechanism is provided) relative to the hanger support 106 (see FIG. 1, showing flexible hanger 108d in the disengaged position). When in the engaged position, the flexible hanger 108a, for instance, defines a closed loop defining a passageway P for receiving and supporting at least one flexible cable (or other moveable component, like a pipe). This helps to contain the cables inside of the closed passageway P so they do not fall out, which is problematic with other/rigid hangers formed in a J-shape that have an upper area that is open and exposed, thus facilitating inadvertent removal of the cables or other supported component.

The flexible hangers 108a-d can each comprise a releasable attachment device 134. In the example shown, each releasable attachment device 134 comprises a pair of hooks 136 coupled to an end of a respective flexible hanger 108a-d, and that is operable to be inserted into and engage corresponding holes 138 formed into the hanger support 106. In another example, the holes can be provided by other structural components coupled to the hanger support, such as O-rings attached to the hanger support 106. In use, an individual may grasp the releaseable attachment device 134 to release or disengage the hooks 136 and open the flexible hanger (e.g., 108d) to allow the individual to remove or insert a movable component (e.g., cable 110). Once the movable component is inserted, the individual can then re-couple or re-engage the attachment device 134 to the hanger support 106. Thus, the hooks 136 can hang from the holes 138 to support the weight of the cables supported by each of the respective flexible hangers.

The flexible hangers can be formed as part of the hanger support 106, such as by forming one flexible strip to have a plurality of closed openings, or the flexible hangers can be each be individual flexible straps that are attached at a lower end to a portion of the hanger support, such as by sewn threads, hook and loop, adhesive, etc., while the upper end of the of the flexible straps can be removably coupled to the hanger support. Note that the flexible hangers described in the present disclosure can include more or less than the four flexible hangers shown in the drawings. The flexible hangers can also have varying lengths, and can have clips for adjustability of the lengths. If one flexible hanger is damaged, it can be easily replaced by another one without having to replace the whole hanger assembly 100, because each flexible hanger (e.g., 108a-d) can be individually attached (e.g., sewn) to the separate strap being the hanger support 106. In another example, the entire hanger support 106 can be removed and replaced without requiring the entire hanger assembly to be replaced.

In one example, a length L1 (FIG. 4B) of the elongate hanger anchor 104 can be the same or greater than a length L3 (FIG. 3A) of the outer rigid support panel 124 of the chassis 116. This allows the elongate hanger anchor 104 to lay on top of the chassis 116 and to distribute a load along the length of the elongate hanger anchor 104 imparted by the weight of the cables 110, as further detailed above.

In some examples, the length L2 of the hanger support 106 relative to the length L1 of the elongate hanger anchor 104 can be a 2:1 ratio, but may be 3:1, 4:1, or greater depending on the length of a particular chassis that the hanger assembly is attached to. For instance, the length L1 can be approximately 2 feet while the length L2 can be approximately 4 feet (i.e., a 2:1 ratio), although other dimensions are contemplated that can distribute a load along a length of an elongate hanger anchor that is overlaid to a support surface.

The hanger assembly 100 described herein is advantageous in applications of being coupled to transit cases (or other portable cases) because of the potential amount of coupling and uncoupling of the electronics cables to and from the electronics systems that can occur when the transit cases are moved periodically, for instance. Thus, the flexible hangers (e.g., 108a-d) provide a quick and efficient mechanism to achieve such periodic coupling and uncoupling of the electronics cables.

Moreover, due to the portable nature/use of transit cases, the electronics cables may be inadvertently pulled, which places an undue strain on the cables at the point at which they are coupled to the electronics assembly. Advantageously, the hanger assembly 100 relieves some or all of such possible strain, because each flexible hanger 108a-d can provide a transition zone along the path of the cables, which can reduce the strain on the cables and their connection points.

In the example where the hanger support 106 comprises a flexible strip material, the hanger assembly 100 can be folded about itself for storage. More particularly, the hanger assembly 100 can be removed from its structure (e.g., chassis 116), and then the hanger support 106 can be folded inwardly toward the elongate hanger anchor 104 by pivoting it proximate the region of the fasteners 128 that attach the hanger support 106 to the elongate hanger anchor 104. The folded hanger assembly can then be stored in this compact configuration and shipped with the transit cases when moved. Alternatively, the hanger support 106 and the flexible hangers 108a-d can be rolled-up in a compact rolled configuration for storage and shipping, whether attached or unattached to the elongate hanger anchor 104.

The elongate hanger anchor 104 can comprise a rigid or semi-rigid material, such as sheet metal, aluminum, and other suitable metals, and even certain composites, polymers, plastics, etc. Alternatively, the elongate hanger anchor can comprise a flexible material, such as a woven fabric strap, rope, cord, or other flexible or semi-flexible material.

In another example, a hanger support can be comprised of a plurality of individual rigid or semi-rigid strips or pieces of material that are linearly connected together by links to form joints, so that the hanger support can somewhat flex or bend about the plurality of joints. Thus, the hanger support is somewhat flexible about the joints, so that it may bend or flex during use to avoid damage to the cables and/or electronics assembly. Therefore, the term "flexible strap" when referring to hanger supports of the present examples can mean a single, non-segmented flexible strap or material, or a plurality of rigid or semi-rigid parts or segments interconnected together (thus defining a plurality of joints) to form the "flexible strap" as discussed above.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some embodiments or features described herein may be combined with other embodiments or features described herein, this disclosure should be read to describe any such combinations that would be practicable by one of ordinary skill in the art. The user of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. A hanger assembly for supporting at least one movable component, comprising:
   an elongate hanger anchor comprising a rigid material having a first end and a second end, the first end having an attachment device for securing the elongate hanger anchor to a structure;
   a hanger support comprising a flexible strap coupled to and extending from the second end of the elongate hanger anchor; and a plurality of flexible hangers supported about the hanger support, wherein the elongate hanger anchor comprises a load bearing interface surface that extends between the first and second ends, the load bearing interface surface being interfaceable to a chassis of an electronics assembly to support a weight of the hanger assembly and of at least one movable component supportable by at least one of the flexible hangers.

2. The hanger assembly of claim 1, wherein the load bearing interface surface comprises a planar surface interfaceable along an outer rigid support panel of the chassis.

3. The hanger assembly of claim 1, wherein the plurality of flexible hangers are linearly arranged along a length of the hanger support.

4. The hanger assembly of claim 1, wherein each of the plurality of flexible hangers comprises a releasable attachment device operable between a disengaged position and an engaged position.

5. The hanger assembly of claim 4, wherein, when in the engaged position, each flexible hanger defines a closed passageway for receiving and supporting the at least one movable component comprising a flexible cable coupleable to an electronics assembly.

6. The hanger assembly of claim 1, wherein the attachment device comprises a pin that extends inwardly about the elongate hanger anchor, and wherein the pin is receivable into an aperture of the structure.

7. The hanger assembly of claim 6, wherein the elongate hanger anchor comprises a coupling flange proximate the second end that couples the hanger support to the elongate hanger anchor, and wherein the pin is offset laterally relative to the coupling flange to provide lateral support of the hanger assembly when coupled to the structure.

8. The hanger assembly of claim 1, wherein the hanger support extends substantially orthogonal relative to the elongate hanger anchor when the hanger assembly is coupled to the structure.

9. A hanger assembly for supporting at least one cable of an electronics assembly, comprising:
an elongate hanger anchor comprising a rigid material and an attachment device at a first end for coupling the elongate hanger anchor to a distal end of a chassis of the electronics assembly, and comprising a support interface portion at a second end for interfacing to a proximal end of the chassis;
a hanger support comprising a flexible member coupled to and extending from the elongate hanger anchor; and
a plurality of flexible hangers supported about the hanger support, each flexible hanger operable to support the at least one cable extending from the electronics assembly,
wherein the elongate hanger anchor comprises a load bearing interface surface that extends between the first and second ends, the load bearing interface surface being interfaceable to the chassis of the electronics assembly to support a weight of the hanger assembly and of at least one movable component supportable by at least one of the flexible hangers.

10. The hanger assembly of claim 9, wherein the elongate hanger anchor is positionable substantially orthogonal to the hanger support when coupled to the electronics assembly.

11. The hanger assembly of claim 9, wherein the elongate hanger anchor has a generally planar surface for interfacing to an outer rigid support panel of the chassis of the electronics assembly.

12. The hanger assembly of claim 9, wherein the plurality of flexible hangers are arranged at different elevations along the hanger support.

13. An electronics assembly having a hanger assembly for supporting a plurality of cables coupled to the electronics assembly, comprising:
a chassis comprising an outer rigid support panel and a hanger attachment portion;
a plurality of electronics ports supported by the chassis;
a plurality of electronics cables coupled to and extending from the plurality of electronic ports;
an elongate hanger anchor comprising a rigid material and an attachment device coupled to the chassis, the elongate hanger anchor interfaced to and extending along the outer rigid support panel of the chassis;
a hanger support comprising a flexible member coupled to and extending transverse from the hanger support; and
a plurality of flexible hangers coupled to the hanger support and supporting the plurality of electronics cables,
wherein the elongate hanger anchor comprises a load bearing interface surface that extends between a first end and a second end of the elongate hanger anchor, the load bearing interface surface being interfaced to the chassis of the electronics assembly to support a weight of the hanger assembly and of the electronics cables by at least one of the flexible hangers.

14. The hanger assembly of claim 13, wherein the hanger attachment portion of the chassis comprises an aperture, and wherein the attachment device comprises a pin extending through the aperture.

15. The hanger assembly of claim 14, wherein the elongate hanger anchor, the hanger support, and the plurality of flexible hangers define the hanger assembly, and wherein the hanger assembly is configured to be coupled to the chassis by an individual and without the use of a tool.

16. The hanger assembly of claim 13, wherein the plurality of flexible hangers are arranged at different elevations along the hanger support, and wherein the elongate hanger anchor and the chassis cooperatively support the weight of the plurality of electronics cables.

17. The hanger assembly of claim 13, wherein the outer rigid support panel comprises a substantially planar surface interfaced to a load bearing interface surface of the elongate hanger anchor, and wherein the elongate hanger anchor is longer than the outer rigid support panel.

18. The hanger assembly of claim 13, wherein the plurality of flexible hangers are compressible against the electronics assembly upon impact from an object to minimize or eliminate damage to the electronics assembly by the plurality of flexible hangers.

* * * * *